United States Patent
Khang et al.

(10) Patent No.: US 7,190,877 B1
(45) Date of Patent: Mar. 13, 2007

(54) METHODS OF FABRICATING NANOCLUSTERS AND DIELECTRIC LAYER HAVING THE SAME

(75) Inventors: Yoon-ho Khang, Yongin-si (KR); Anatoly V. Dvurechenskiy, Novosibirsk (RU)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/392,762

(22) Filed: Mar. 30, 2006

(30) Foreign Application Priority Data

Aug. 31, 2005 (KR) ............... 10-2005-0080618

(51) Int. Cl.
*G02B 6/00* (2006.01)
*H01L 21/02* (2006.01)

(52) U.S. Cl. ............ 385/147; 385/141; 438/381; 977/779; 977/810; 977/890

(58) Field of Classification Search ........ 385/129–132, 385/141–145, 147; 438/257, 264, 316, 591, 438/381; 977/890–892, 779, 810
See application file for complete search history.

(56) References Cited

U.S. PATENT DOCUMENTS 6,656,792 B2 * 12/2003 Choi et al. ............ 438/257
6,659,792 B2 12/2003 Saka ................... 439/367

* cited by examiner

*Primary Examiner*—John D. Lee
(74) *Attorney, Agent, or Firm*—Harness, Dickey & Pierce, P.L.C.

(57) ABSTRACT

Methods of fabricating nanoclusters, e.g., germanium nanoclusters, and/or a dielectric layer having the same are provided. The method may include forming a first silicon oxide layer on a silicon substrate; forming a germanium (GeO) layer on the silicon oxide layer; altering the germanium oxide (GeO) layer into a germanium dioxide ($GeO_2$) layer and/or a first group of germanium (Ge) nanoclusters; and/or altering germanium dioxide ($GeO_2$) into silicon dioxide ($SiO_2$) such that a second group of germanium (Ge) nanoclusters may be formed. The nanoclusters, e.g., germanium nanoclusters, may have more homogeneous sizes and/or may be more evenly arranged the dielectric layer such that the nanoclusters, e.g., germanium nanoclusters, may be easily used in a semiconductor device.

20 Claims, 3 Drawing Sheets

METHODS OF FABRICATING NANOCLUSTERS AND DIELECTRIC LAYER HAVING THE SAME

PRIORITY STATEMENT

This application claims the benefit of Korean Patent Application No. 10-2005-0080618, filed on Aug. 31, 2005, in the Korean Intellectual Property Office, the contents of which are incorporated herein in its entirety by reference.

BACKGROUND OF THE INVENTION

1. Field of the Invention

Example embodiments of the present invention relate to methods of fabricating nanoclusters and/or a dielectric layer having the same. Other example embodiments relate to methods of forming a dielectric layer formed of silicon oxide having embedded germanium nanoclusters.

2. Description of the Related Art

A semiconductor nanocluster in a dielectric layer may be used as a floating gate for a flash memory device. The flash memory device using the nanocluster may be less sensitive to a leakage current which may cause an outflow of electric charges during the storage of information. Thus, the storage period for information may potentially increase. Because nano-dots having a smaller size (e.g., 10 nm or less) may be used in the floating gate, a Coulumb blockage effect may occur at approximately room temperature. Accordingly, a threshold voltage shift may be quantized and/or multi-bit information may be stored.

According to the conventional art, nanoclusters may be formed in a substrate using an ion implantation process and/or by controlling processing conditions (e.g., deposition temperature and/or deposition pressure). It may be difficult to obtain nanoclusters having more homogeneous sizes and/or more homogeneous distances therebetween. The conventional art discloses a flash memory having a floating gate of germanium (Ge) nano-dots formed using a germanium (Ge) ion implantation process.

SUMMARY OF THE INVENTION

Example embodiments of the present invention relate to methods of fabricating nanoclusters and/or a dielectric layer having the same. Other example embodiments relate to methods of fabricating a dielectric layer formed of silicon oxide having embedded germanium nanoclusters.

In yet other example embodiments, the nanoclusters may have more homogeneous sizes and/or may be more evenly arranged in the dielectric layer such that the nanoclusters may be used in a semiconductor device.

According to an example embodiments of the present invention, methods of fabricating the dielectric layer having germanium (Ge) nanoclusters may include forming a first silicon dioxide ($SiO_2$) layer on a silicon substrate; forming a germanium oxide (GeO) layer on the first silicon dioxide ($SiO_2$) layer; altering the germanium oxide (GeO) layer into a germanium dioxide ($GeO_2$) layer and/or a first group of germanium (Ge) nanoclusters; and/or altering the germanium dioxide ($GeO_2$) layer into a second silicon dioxide ($SiO_2$) layer such that a second group of germanium (Ge) nanoclusters may form. The first and/or second silicon dioxide layers may combine to form a silicon dioxide layer, wherein the first group and/or second group of germanium (Ge) nanoclusters may be embedded therein.

The formation of the first silicon dioxide ($SiO_2$) layer may be performed using chemical vapor deposition (CVD), oxidizing the silicon substrate and/or any other appreciated method.

The germanium oxide (GeO) layer may be formed by depositing germanium (Ge) on the first silicon dioxide ($SiO_2$) layer in an oxygen ($O_2$) atmosphere, having a relatively low concentration of oxygen. The germanium oxide (GeO) layer may be deposited by a CVD process under oxygen ($O_2$) atmosphere having a 0.01% or less oxygen concentration.

Altering the germanium oxide (GeO) layer into the germanium dioxide ($GeO_2$) and/or the first group of germanium (Ge) nanoclusters may be performed by annealing at a temperature of approximately 660° C. or lower.

Altering the germanium dioxide ($GeO_2$) into the second silicon dioxide ($SiO_2$) layer may include depositing a silicon layer on the germanium dioxide ($GeO_2$) and annealing at a temperature of about 600–950° C. such that the second group of germanium (Ge) nanoclusters is formed in the second silicon dioxide ($SiO_2$) layer.

The deposition of the silicon layer may be performed using a CVD process, a plasma vapor deposition (PVD) process and/or any other appreciated method. The deposition of the silicon layer may be performed such that a thickness of the silicon layer may be about 20%–100% of the germanium dioxide ($GeO_2$) layer.

In another example embodiment, altering of the germanium dioxide ($GeO_2$) into the second silicon dioxide ($SiO_2$) layer may be performed by annealing at a temperature of approximately 600° C.–950° C. such that silicon (Si) atoms of the silicon substrate, first silicon dioxide ($SiO_2$) layer and/or silicon layer may diffuse and/or react with the germanium dioxide ($GeO_2$) layer.

According to other example embodiments, a method of forming a dielectric layer having nanoclusters may include forming a first lower-affinity oxide layer and/or a first higher-affinity oxide layer, respectively, on a substrate. The first higher-affinity oxide layer may be altered such that a second higher-affinity oxide layer and/or a first group of nanoclusters may be formed. The second higher-affinity oxide layer may be altered such that a second lower-affinity oxide layer and/or a second group of nanoclusters may be formed.

BRIEF DESCRIPTION OF THE DRAWINGS

Example embodiments of the present invention will be more clearly understood form the following detailed description taken in conjunction with the accompanying drawings.

FIGS. 1 and 2 are cross-sectional views illustrating for explaining a method of fabricating germanium (Ge) nanoclusters according to an example embodiment of the present invention;

FIG. 3 is a photograph of germanium (Ge) nanoclusters embedded in a germanium dioxide ($GeO_2$) matrix according to an example embodiment of the present invention; and FIG. 4 is cross-sectional view illustrating a method of converting a germanium ($GeO_2$) layer into a silicon dioxide ($SiO_2$) layer according to an example embodiment of the present invention.

FIG. 5 is cross-sectional view illustrating a method of forming a silicon dioxide ($SiO_2$) layer according to an example embodiment of the present invention.

DETAILED DESCRIPTION OF EXAMPLE EMBODIMENTS

Figure 1:
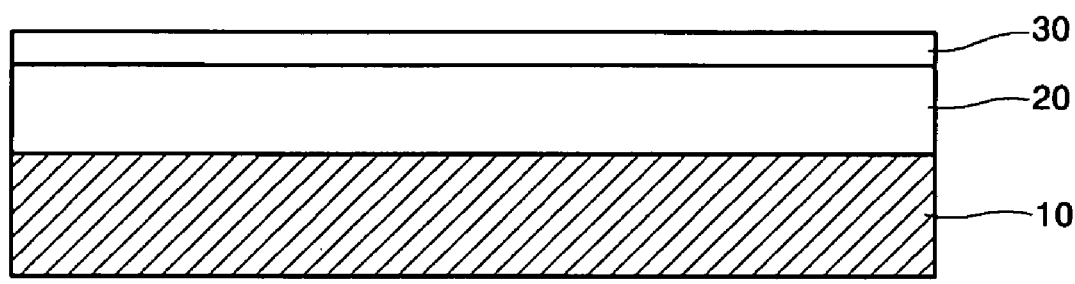
FIGS. 1–5 represent non-limiting example embodiments of the present invention as described herein.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Other words used to describe the relationship between elements should be interpreted in a like fashion (e.g., "between" versus "directly between", "adjacent" versus "directly adjacent", etc.).

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments of the present invention.

Spatially relative terms, such as "beneath", "below", "lower", "above", "upper" and the like, may be used herein for ease of description to describe one element or a feature's relationship to another element or feature as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Also, the use of the words "compound," "compounds," or "compound(s)," refer to either a single compound or to a plurality of compounds. These words are used to denote one or more compounds but may also just indicate a single compound.

Example embodiments of the present invention are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments of the invention should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope of the present invention.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments of the present invention belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments of the present invention, various aspects of the present invention will be described in detail with reference to the attached drawings. However, the present invention is not limited to the example embodiments described. In the figures, if a layer is formed on another layer or a substrate, it means that the layer is directly formed on another layer or a substrate, or that a third layer is interposed therebetween. In the following description, the same reference numerals denote the same elements.

Example embodiments of the present invention relate to a method of fabricating germanium nanoclusters and/or dielectric layer having the same. Other example embodiments relate to a method of fabricating a dielectric layer formed of silicon oxide having embedded germanium nanoclusters.

Figure 2:
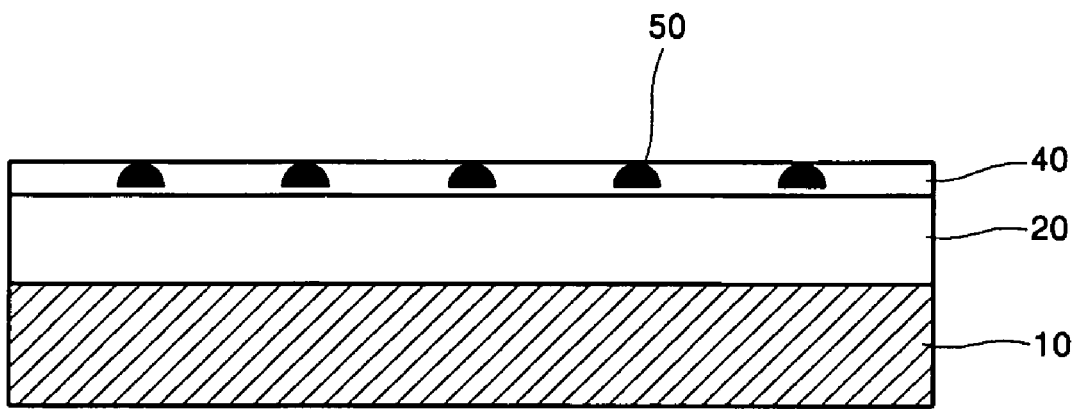

FIGS. 1 and 2 are views for explaining a method of fabricating germanium (Ge) nanoclusters according to an example embodiment of the present invention.

Referring to FIG. 1, a first silicon oxide ($SiO_2$) layer 20 may be formed on a silicon (Si) substrate 10. The silicon dioxide ($SiO_2$) layer 20 may be formed using a chemical vapor deposition (CVD) process. Alternatively, the first silicon dioxide ($SiO_2$) layer 20 may be formed using a plasma oxidation process, a thermal oxidation process and/or any other method appreciated in the art.

The silicon (Si) substrate 10 may be placed into a CVD chamber, and the oxygen in the chamber may be substantially removed. The temperature in the chamber may be maintained at approximately 620° C. An inert gas may be supplied to the chamber for about 10 minutes. The inert gas may be helium (He) gas, which may have a density of $7 \times 10^{19}$ $cm^{-2} \cdot s^{-1}$. A gas including germanium (Ge) (e.g., $GeH_4$ gas) may also be supplied into the chamber. The gas including germanium (Ge) may be supplied to the chamber in addition to the helium (He) gas. The helium (He) gas may have approximately an oxygen concentration of 0.01% or less. A lower concentration of oxygen ($O_2$) may produce a germanium oxide (GeO) layer 30, rather than a germanium dioxide ($GeO_2$) layer, on the first silicon dioxide ($SiO_2$) layer 20. Alternatively, germanium (Ge) may be supplied to the chamber using a germanium (Ge) sputtering process or any other process appreciated in the art.

Referring to FIG. 2, annealing (e.g., the silicon substrate 10) at an approximate temperature of 660° C. or lower may separate the germanium oxide (GeO) layer 30 into a germanium dioxide ($GeO_2$) layer 40 and/or a first group of germanium (Ge) nanoclusters 50 as follows:

$$2GeO \rightarrow GeO_2 + Ge \quad (1)$$

Figure 3:
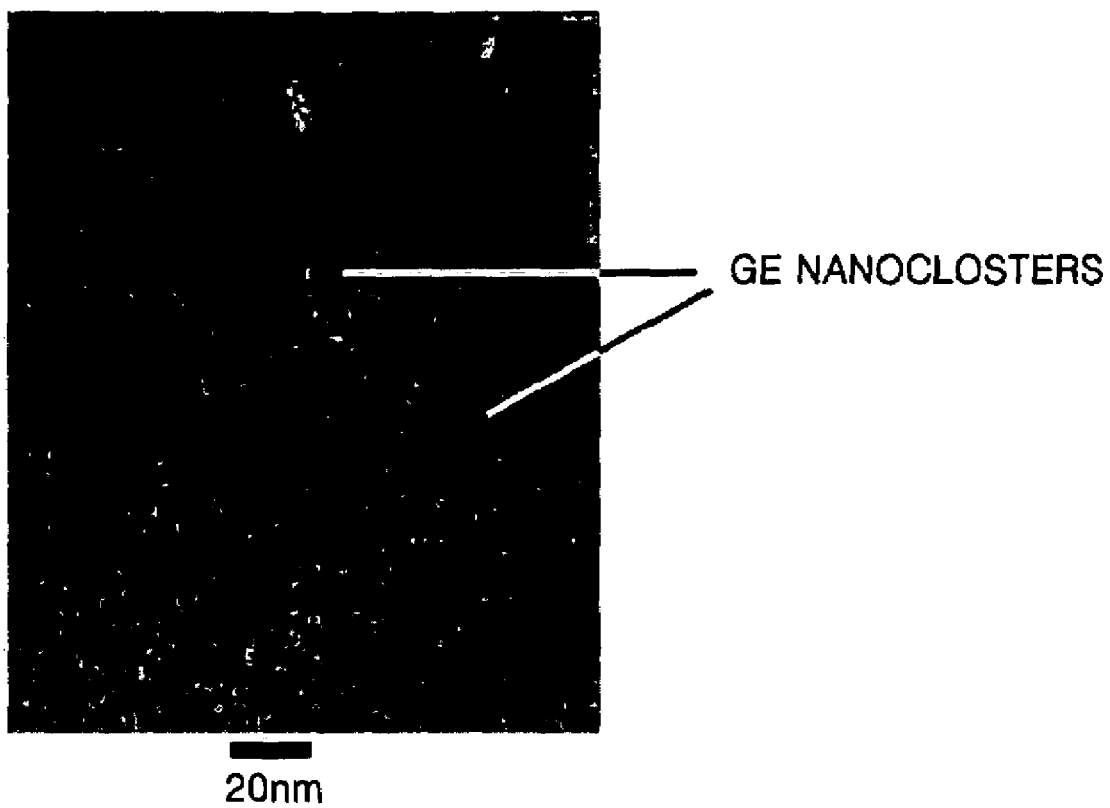

FIG. 3 is a high-resolution transmission electron microscope (HR-TEM) image of germanium (Ge) nanoclusters embedded in a germanium dioxide ($GeO_2$) matrix according to an example embodiment of the present invention. Referring to FIG. 3, dark dots are germanium (Ge) nanoclusters, and gray background is the germanium dioxide ($GeO_2$) matrix. The average size of germanium (Ge) nanoclusters in the germanium dioxide ($GeO_2$) matrix may be approximately 5–7 nm with a deviation of less than 2 nm. The germanium (Ge) nanoclusters may have a density of about $10^{12}/cm^2$.

The germanium dioxide ($GeO_2$) may be further altered into silicon dioxide ($SiO_2$). Due to the lack of stability, hydroscopic nature and/or high density states at interfaces of germanium dioxide ($GeO_2$), germanium dioxide may not be as desirable for electronic devices.

Figure 4:
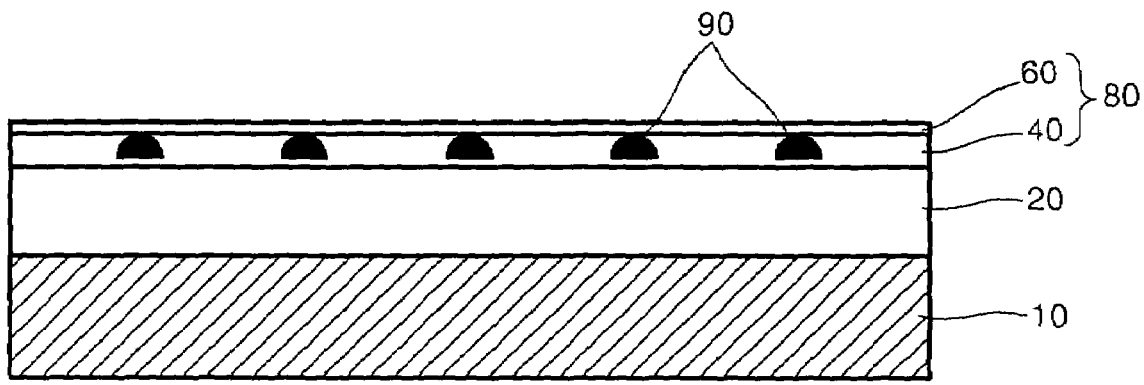
Figure 5:
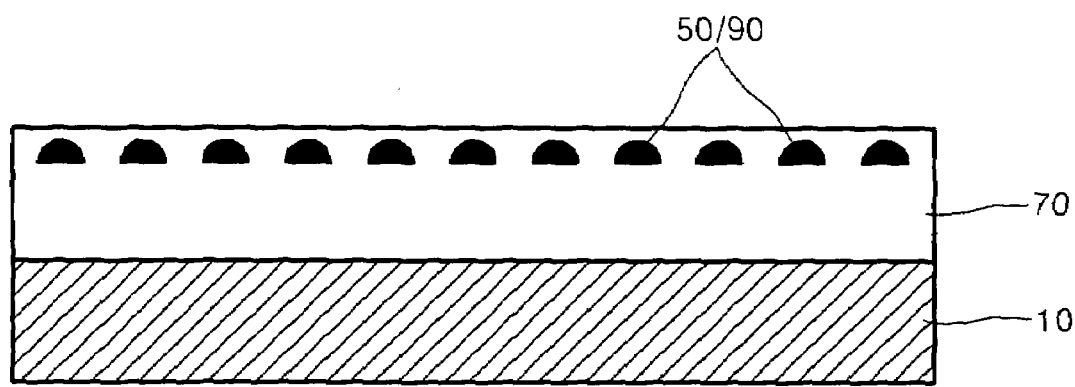

FIGS. 4 and 5 are cross-sectional views for explaining a method of altering a germanium dioxide ($GeO_2$) layer 40 into a second silicon dioxide ($SiO_2$) layer 80 according to example embodiments of the present invention.

Referring to FIG. 4, a silicon (Si) layer 60 may be deposited on the germanium dioxide ($GeO_2$) layer 40 using a CVD method and/or a plasma vapor deposition (PVD) method. A thickness of the silicon (Si) layer 60 may be sufficiently thick to alter substantially the entire the germanium dioxide ($GeO_2$) layer 40 into the second silicon dioxide ($SiO_2$) layer 80, and the thickness of the silicon (Si) layer 60 may be approximately 20–100% as thick as the germanium dioxide ($GeO_2$) layer 40. For example, when the thickness of germanium dioxide ($GeO_2$) layer 40 is 20 nm, the silicon (Si) layer 60 may be formed and/or deposited, to a thickness of about 5–10 nm.

According to an example embodiment of the present invention, annealing may form a second group of germanium (Ge) nanoclusters 90 in the second silicon dioxide layer ($SiO_2$) 80.

According to yet other example embodiments of the present invention, annealing may diffuse silicon (Si) atoms of the silicon layer 60, the first silicon dioxide layer 20 and/or the silicon substrate 10 for reaction with the germanium dioxide ($GeO_2$) layer.

Annealing (e.g., the silicon (Si) substrate 10) at a temperature of about 600–950° C. (e.g., at a temperature of about 800° C.) for approximately 10–20 minutes, the germanium dioxide ($GeO_2$) layer 40 may be transformed into the second silicon dioxide ($SiO_2$) layer 80, as shown by Formula (2):

$$GeO_2 + Si \rightarrow SiO_2 + Ge \quad (2)$$

Referring to FIG. 5, a silicon dioxide layer 70 may be formed from the first silicon dioxide layer 20 and/or the second silicon dioxide layer 80. The silicon dioxide ($SiO_2$) layer 70 may be relatively thin (e.g., 10 nm or less). The first group of germanium (Ge) nanoclusters 50 and/or the second group of germanium (Ge) nanoclusters 90 may be formed and/or embedded in the silicon dioxide layer 70.

According to example embodiments of the present invention, a silicon dioxide ($SiO_2$) dielectric layer with more evenly embedded germanium (Ge) nanoclusters may be fabricated. The germanium dioxide ($GeO_2$) layer surrounding the more homogeneously formed germanium (Ge) nanoclusters may be converted into silicon dioxide ($SiO_2$). The germanium (Ge) nanoclusters may be more homogenously embedded in the silicon dioxide ($SiO_2$) layer 70. The nanocluster structure may be applied to the fabrication of a flash memory device and/or similar device.

While example embodiments have been described in terms of silicon dioxide, germanium oxide and/or germanium dioxide, one of ordinary skill in the art should appreciate that these compounds may be referenced in terms of a lower-affinity compound, a higher-affinity compound and/or a derivative of the higher-affinity compound, respectively, such that the lower-affinity compound may exhibit a weaker chemical bond to a base compound and/or element (e.g., oxygen) than the higher-affinity compound. The higher-affinity compound may exhibit a weaker chemical bond to the base compound and/or element than the derivative of the higher affinity compound.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A method of forming a dielectric layer having germanium (Ge) nanoclusters, comprising:
    forming a first silicon dioxide ($SiO_2$) layer on a silicon substrate;

forming a germanium oxide (GeO) layer on the first silicon dioxide (SiO$_2$) layer;

altering the germanium oxide (GeO) layer into a germanium dioxide (GeO$_2$) layer and a first group of germanium (Ge) nanoclusters; and altering the germanium dioxide (GeO$_2$) layer into a second silicon dioxide (SiO$_2$) layer, wherein a second group of germanium (Ge) nanoclusters is formed.

2. The method of claim 1, wherein forming the first silicon dioxide (SiO$_2$) layer is performed using a chemical vapor deposition or oxidizing the silicon substrate.

3. The method of claim 1, wherein forming the germanium oxide (GeO) layer includes depositing germanium (Ge) on the first silicon dioxide (SiO$_2$) layer in an oxygen (O$_2$) atmosphere.

4. The method of claim 3, wherein forming the germanium oxide (GeO) layer includes depositing germanium (Ge) using a chemical vapor deposition process and the oxygen atmosphere has an oxygen concentration of oxygen is 0.01% or less.

5. The method of claim 1, wherein altering the germanium oxide (GeO) layer is performed by annealing at a temperature of approximately 600° C. or lower.

6. The method of claim 1, wherein altering the germanium dioxide (GeO$_2$) layer includes depositing a silicon layer on the germanium dioxide (GeO$_2$) layer, and annealing at a temperature of about 600–950° C. to form the second group of germanium (Ge) nanoclusters in the second silicon dioxide (SiO$_2$) layer.

7. The method according to 1, further comprising forming a silicon dioxide (SiO$_2$) layer from the first and second silicon dioxide (SiO$_2$) layers after altering the germanium dioxide (GeO$_2$) layer, wherein the first group and the second group of germanium (Ge) nanoclusters are embedded therein.

8. The method of claim 6, wherein the temperature is about 800° C.

9. The method of claim 6, wherein depositing the silicon layer is performed using a chemical vapor deposition process or a plasma vapor deposition process.

10. The method of claim 6, wherein the silicon layer has a thickness of approximately 20%–100% of a thickness of the germanium dioxide (GeO$_2$) layer.

11. The method of claim 1, wherein altering the germanium dioxide (GeO$_2$) layer includes depositing a silicon layer on the germanium dioxide (GeO$_2$) layer and annealing at a temperature of approximately 600° C.–950° C. to diffuse silicon (Si) atoms from a silicon layer, the first silicon dioxide layer and silicon substrate such that the silicon atoms react with the germanium dioxide (GeO$_2$) layer.

12. A dielectric layer having germanium (Ge) nanoclusters formed according the method of claim 1.

13. A method for fabricating germanium (Ge) nanoclusters embedded in silicon dioxide (SiO$_2$) comprising:

altering germanium oxide (GeO) into germanium dioxide (GeO$_2$) and a first group of germanium (Ge) nanoclusters; and altering the germanium dioxide (GeO$_2$) into silicon dioxide (SiO$_2$) wherein a second group of germanium (Ge) nanoclusters is formed.

14. The method of claim 13, wherein altering the germanium oxide (GeO) includes annealing at a temperature of approximately 600° C. or lower such that oxygen atoms from an oxygen-enriched atmosphere react with the germanium oxide (GeO).

15. The method of claim 13, wherein altering the germanium dioxide (GeO$_2$) includes annealing at a temperature of approximately 600° C.–950° C. for about 10–20 minutes to diffuse silicon (Si) atoms from the silicon dioxide into the germanium dioxide (GeO$_2$).

16. The method of claim 13, wherein altering the germanium (GeO$_2$) dioxide includes annealing at a temperature of approximately 600° C.–950° C. for about 10–20 minutes to form the second group of germanium (Ge) nanoclusters.

17. A dielectric layer having germanium (Ge) nanoclusters formed according the method of claim 13.

18. A method of forming a dielectric layer having nanoclusters comprising:

forming a first lower-affinity oxide layer on a substrate;

forming a first higher-affinity oxide layer on the first lower-affinity oxide layer;

altering the first higher-affinity oxide layer into a second higher-affinity oxide layer and a first group of nanoclusters; and altering the second higher-affinity oxide layer into a second lower-affinity oxide layer wherein a second group of nanoclusters is formed.

19. The method of claim 18, wherein the first lower-affinity oxide layer includes silicon oxide (SiO), the first higher-affinity oxide layer includes germanium oxide (GeO), the second higher-affinity oxide layer includes germanium dioxide (GeO$_2$), the second lower-affinity oxide layer includes silicon dioxide (SiO$_2$), and the first group and the second group of nanoclusters include germanium (Ge).

20. A method for fabricating germanium (Ge) nanoclusters embedded in silicon dioxide (SiO$_2$), comprising:

altering germanium oxide (GeO) into germanium dioxide (GeO$_2$) and a first group of germanium (Ge) nanoclusters by annealing at a temperature of approximately 600° C. or lower; and altering the germanium dioxide (GeO$_2$) into silicon dioxide (SiO$_2$) wherein a second group of germanium (Ge) nanoclusters is formed.

* * * * *